(12) United States Patent
Belady et al.

(10) Patent No.: US 7,212,409 B1
(45) Date of Patent: May 1, 2007

(54) CAM ACTUATED COLD PLATE

(75) Inventors: Christian L. Belady, Richardson, TX (US); Christopher C. Womack, San Diego, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 23 days.

(21) Appl. No.: 11/294,922

(22) Filed: Dec. 5, 2005

(51) Int. Cl.
*H05K 7/20* (2006.01)
(52) U.S. Cl. .................................... 361/721
(58) Field of Classification Search ............... 361/721, 361/704, 785, 711, 707, 717, 687, 688, 689; 439/487; 174/16.3
See application file for complete search history.

(56) References Cited

U.S. PATENT DOCUMENTS

| | | | |
|---|---|---|---|
| 4,153,107 A | 5/1979 | Antonetti et al. | |
| 4,226,281 A | 10/1980 | Chu | |
| 4,402,563 A * | 9/1983 | Sinclair | 439/264 |
| 5,097,385 A | 3/1992 | Chao-Fan Chu et al. | |
| 5,123,855 A * | 6/1992 | Petersen | 439/263 |
| 5,394,299 A | 2/1995 | Chu et al. | |
| 5,920,457 A | 7/1999 | Lamb et al. | |
| 5,973,924 A * | 10/1999 | Gillespie, Jr. | 361/735 |
| 6,219,241 B1 * | 4/2001 | Jones | 361/704 |
| 6,243,267 B1 * | 6/2001 | Chuang | 361/704 |
| 6,280,222 B1 * | 8/2001 | Walkup | 439/331 |
| 6,404,640 B1 * | 6/2002 | Ishimine et al. | 361/720 |
| 6,431,899 B1 * | 8/2002 | Keller | 439/342 |
| 6,485,321 B1 * | 11/2002 | Trout et al. | 439/342 |
| 6,672,878 B2 * | 1/2004 | Dean | 439/67 |
| 6,771,507 B1 | 8/2004 | Belady et al. | |
| 6,819,562 B2 | 11/2004 | Boudreaux et al. | |
| 6,829,142 B2 | 12/2004 | Belady et al. | |
| 6,867,976 B2 | 3/2005 | Belady et al. | |
| 6,882,533 B2 * | 4/2005 | Bash et al. | 361/696 |
| 7,167,366 B2 * | 1/2007 | Cheon | 361/699 |
| 2004/0173345 A1 | 9/2004 | Belady et al. | |

\* cited by examiner

*Primary Examiner*—Chandrika Prasad
(74) *Attorney, Agent, or Firm*—David W. Boyd

(57) ABSTRACT

A cooling system for a computer includes a cam-actuated cold plate. Compliant, thermally conductive pins on the cold plate contact electronic heat generating electronic components when the cold plate is moved toward a circuit assembly that includes the electronic components. Optionally, the cold plate may be cooled by circulating coolant through it.

17 Claims, 9 Drawing Sheets

CAM ACTUATED COLD PLATE

FIELD OF THE INVENTION

The present invention relates generally to computer systems, and more specifically to the cooling of computer systems.

BACKGROUND

Designers of computer systems face many competing objectives. In order to achieve maximum computational performance, electronic computer components such as processor chips are often very complex and are operated at high clock speeds, resulting in significant power dissipation. In order to prevent physical damage from high temperatures that would otherwise be generated, special attention is paid to cooling these components. Natural and forced convection with air may be inadequate, so various devices and techniques have been developed for removing heat from electronic components by thermal conduction. In some systems, a conformable array of thermally conductive pins contacts components on a printed circuit board and conducts heat generated by the components into a heat dissipating object. The heat dissipating object may be further cooled by convection in air, by having a chilled fluid circulated within it, or by a combination of such methods.

At the same time, it is desirable that a computer system be small. The goal of small size competes with the goal of maximum performance. To achieve maximum performance, it is desirable to include many heat-generating components and to operate them at their extreme capabilities, but enclosing them in a small space can result in the interior of the space rising to a temperature significantly above the ambient environment. Furthermore, the goal of small size makes it difficult to include components designed to cool the electronics inside the computer. The small size may also hinder convenient service and maintenance of the computer.

DETAILED DESCRIPTION

Figure 1:
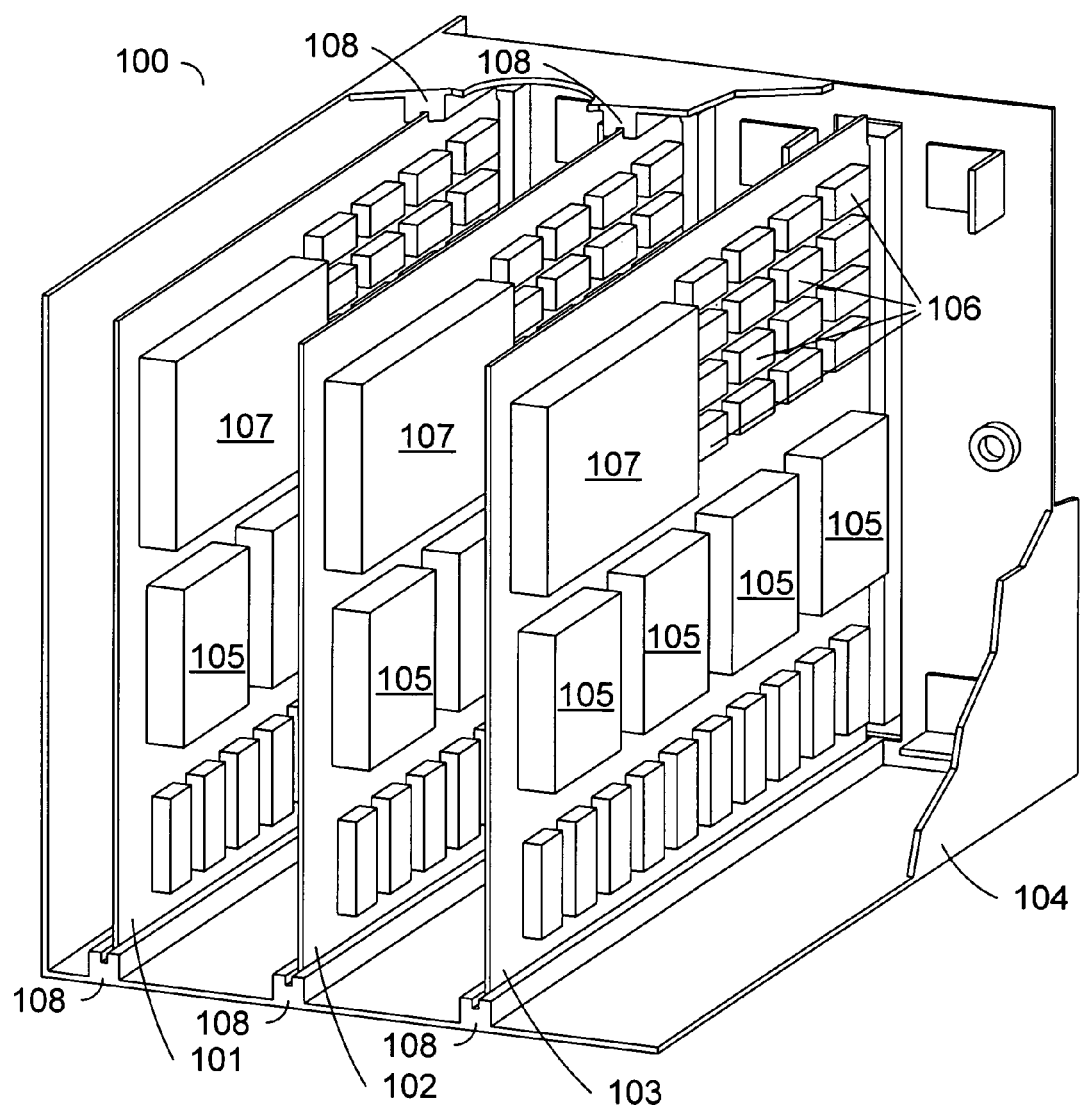
FIG. 1 shows a simplified cutaway perspective view of a computer system in accordance with an example embodiment of the invention.

FIG. 1 shows a simplified cutaway perspective view of a computer system 100 in accordance with an example embodiment of the invention. Several components of computer system 100 have been omitted from FIG. 1 for clarity. Example computer system 100 is a "blade server", although the invention may be embodied in computer systems of other configurations as well. In a blade server, several relatively thin printed circuit assemblies 101, 102, 103 share an enclosure 104. Each relatively thin printed circuit assembly is called a "blade", and may comprise one or more microprocessors 105, memory 106, storage devices 107, and other circuitry such as network connections or other interfaces. The blades 101, 102, 103 are shown in a simplified manner in FIG. 1. The various components on each blade are of differing heights, although this is not a requirement. Each of the blades in example computer system 100 is identical to the others, but this also is not a requirement.

Each blade 101, 102, 103 mounts into enclosure 104 via guides 108, and preferably makes connection to common electrical connections at the rear of enclosure 104. The blades share a common power supply (not shown) and may share other resources, enabling a compact design. Example computer system 100 comprises three positions, or "slots" for receiving blades, and each slot is populated. Any practical number of slots may be provided, and not all slots need be populated. The blades in a blade server may be hot swappable.

Figure 2:
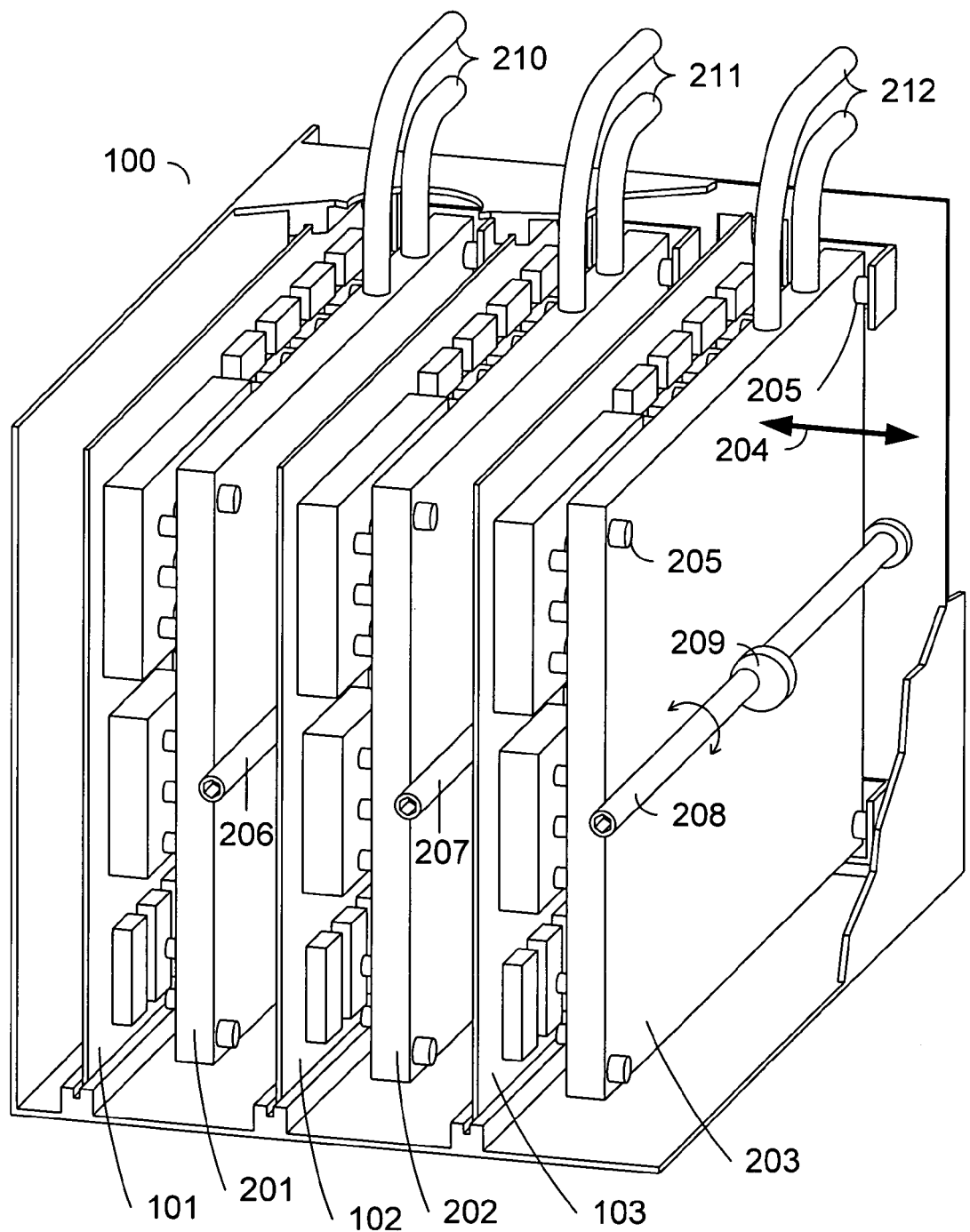
FIG. 2 shows the example computer system of FIG. 1 with a cooling system in place, according to an example embodiment of the invention.

FIG. 2 shows example computer system 100 with a cooling system in place according to an example embodiment of the invention. Again, some of the structure of computer system 100, notably the front of enclosure 104, has been omitted from the drawing for clarity. In FIG. 2, a cold plate 201, 202, 203 has been supplied for each blade 101, 102, 103. Note that it is not necessary that each blade or each slot be provided with a cold plate. Each cold plate 201, 202, 203 is mounted such that it can translate back and forth in the directions indicated by arrow 204. Preferably, each cold plate is attached so that it is biased away from its corresponding blade. For example, attachment points 205 of cold plate 203 may use tension springs that tend to pull cold plate 203 away from blade 103. One of skill in the art will envision other attachment schemes for biasing a cold plate away from its corresponding blade.

Also provided are cam shafts 206, 207, 208, one for each cold plate 201, 202, 203. Cam shaft 208 is representative, and further comprises cam 209, which is fixed to cam shaft 208. When cam shaft 208 is rotated about its longitudinal axis from the position indicated in FIG. 2, cam 209 alternately forces cold plate 203 toward blade 103 or allows cold plate 203 to move away from blade 103, depending on the angular position and direction of rotation of cam shaft 208. Other kinds of cam designs may be used as well. For example, one of skill in the art may envision actuating each cold plate 201, 202, 203 with a pin and slot cam, a face cam, or some other type of cam. Multiple cams may be used for each cold plate, either operated independently or linked to operate in concert. In other alternative designs, each cold plate may be biased toward its corresponding circuit board, and be lifted away from the circuit board by a cam.

Coolant may circulate through each cold plate 201, 202, 203, through pipes 210, 211, and 212. Preferably, pipes 210, 211, 212 are flexible, enabling each cold plate to move under the influence of its corresponding cam and cam shaft. The coolant may be a fluid, such as water, ethylene glycol, or a mixture of these or other fluids. The coolant may be a gas, such as air. Or the coolant may be a two phase material. The coolant may be chilled or refrigerated. Other methods of cooling the cold plates 201, 202, 203 are also possible. For example, heat may be drawn from a cold plate using a heat pipe, a thermosiphon, forced air convection, or simply natural air convection. Because pipes 210, 211, 212 are preferably flexible, any blade 101, 102, 103 may be replaced without disconnecting any of pipes 210, 211, 212. Service of computer 100 is simplified, and the risk of spillage of coolant is avoided.

Figure 3:
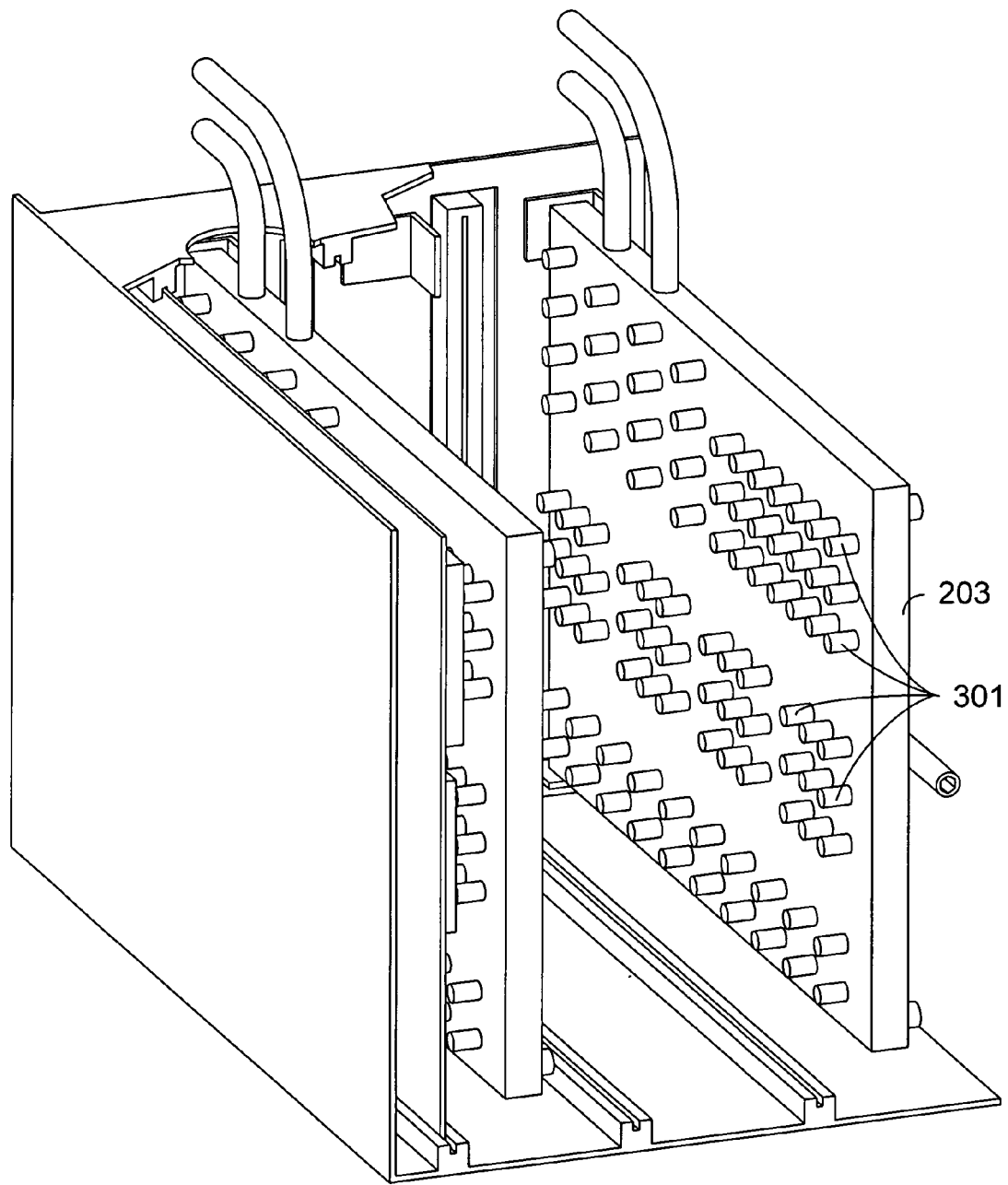
FIG. 3 shows an alternate perspective view of the computer system of FIG. 1.

FIG. 3 shows a reverse perspective view of example computer system 100, with several components removed so that cold plate 203 is clearly visible. Cold plate 203 typifies the other cold plates in computer system 100, and further comprises a field of thermally conductive pins 301. Pins 301 are preferably spring-loaded and retained in cold plate 203 such that when cold plate 203 is lifted away from blade 103, pins 301 remain secured in cold plate 203. Preferably, the pins and retention are as described in U.S. Pat. No. 6,867, 976, the full disclosure of which is hereby incorporated by reference. The number and arrangement of the pins may be chosen based on the amount of heat transfer required and on the arrangement and kind of components on the corresponding blade. For example, some components may not require cooling beyond that provided by natural convection, and therefore pins may not be provided to contact those components. While pins 301 are shown as right circular cylinders, other shapes are possible. For example, the pins may have a cross section that is rectangular, elliptical, or of another shape. Preferably, each cold plate and the pins are made of a thermally conductive material such as copper, aluminum, graphite, or diamond.

When cold plate 203 is moved toward blade 103 by the action of cam 209, pins 301 contact components on blade 103. Because pins 301 are compliant, preferably spring loaded, those pins contacting tall components can compress into cold plate 203 and allow cold plate 203 to continue approaching blade 103 until other pins contact any short components on blade 103. In this way, the field of pins 301 can conform to the topology of blade 103. The pins 301 conduct heat away from the heat generating components on blade 103, into the main body of cold plate 203, where the heat may be carried away by coolant entering and exiting cold plate 203 via pipes 212.

Figure 4A:
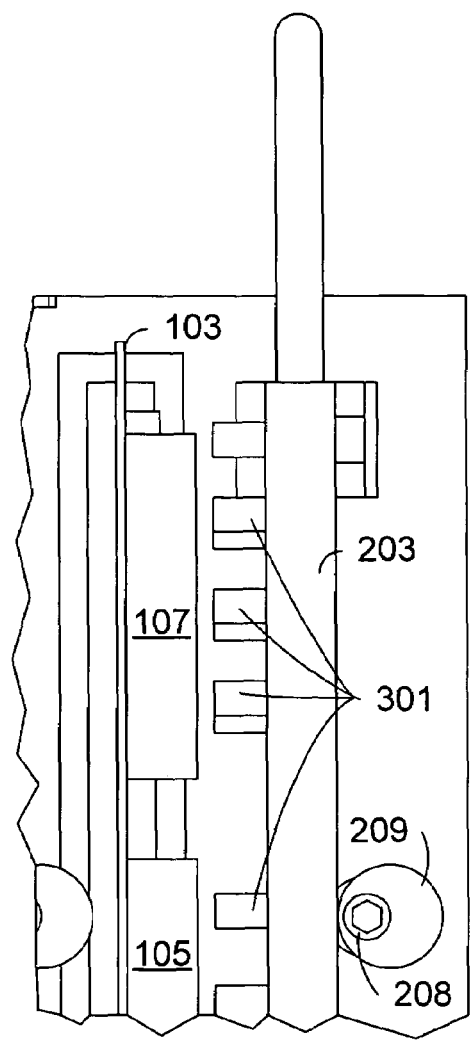
FIGS. 4A and 4B show close-up orthogonal views of the computer system of FIG. 1, in accordance with an example embodiment of the invention.
Figure 4B:
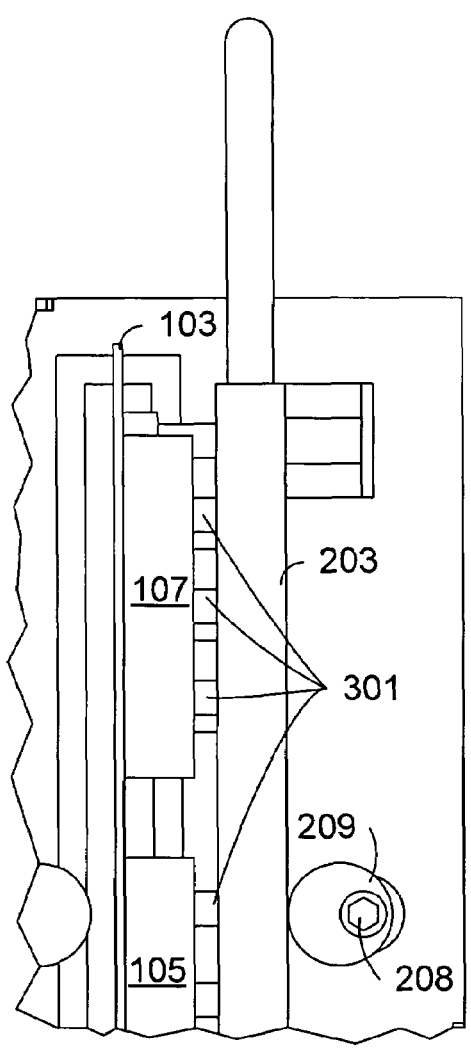

FIGS. 4A and 4B show a close-up orthogonal view of example computer system 100, showing cold plate 203 in two positions. FIG. 4A shows cold plate 203 in its "open" position, in which cam shaft 208 has been rotated to allow cold plate to move away from blade 103. FIG. 4B shows cold plate 203 in its "closed" position. Cam shaft 208 has been rotated such that cam 209 has moved cold plate 203 toward blade 103, placing pins 301 in contact with components on blade 103.

In the open position shown in FIG. 4A, pins 301 of cold plate 203 are clear of the components on blade 103 so that blade 103 can be removed from computer system 100 without interference. Service and maintenance of computer system 100 are convenient. Furthermore, cold plates 201, 202, 203 are slender and oriented generally parallel to blades 101, 102, 103. The cooling system in accordance with this example embodiment of the invention allows for a compact design for computer system 100.

Figure 5:
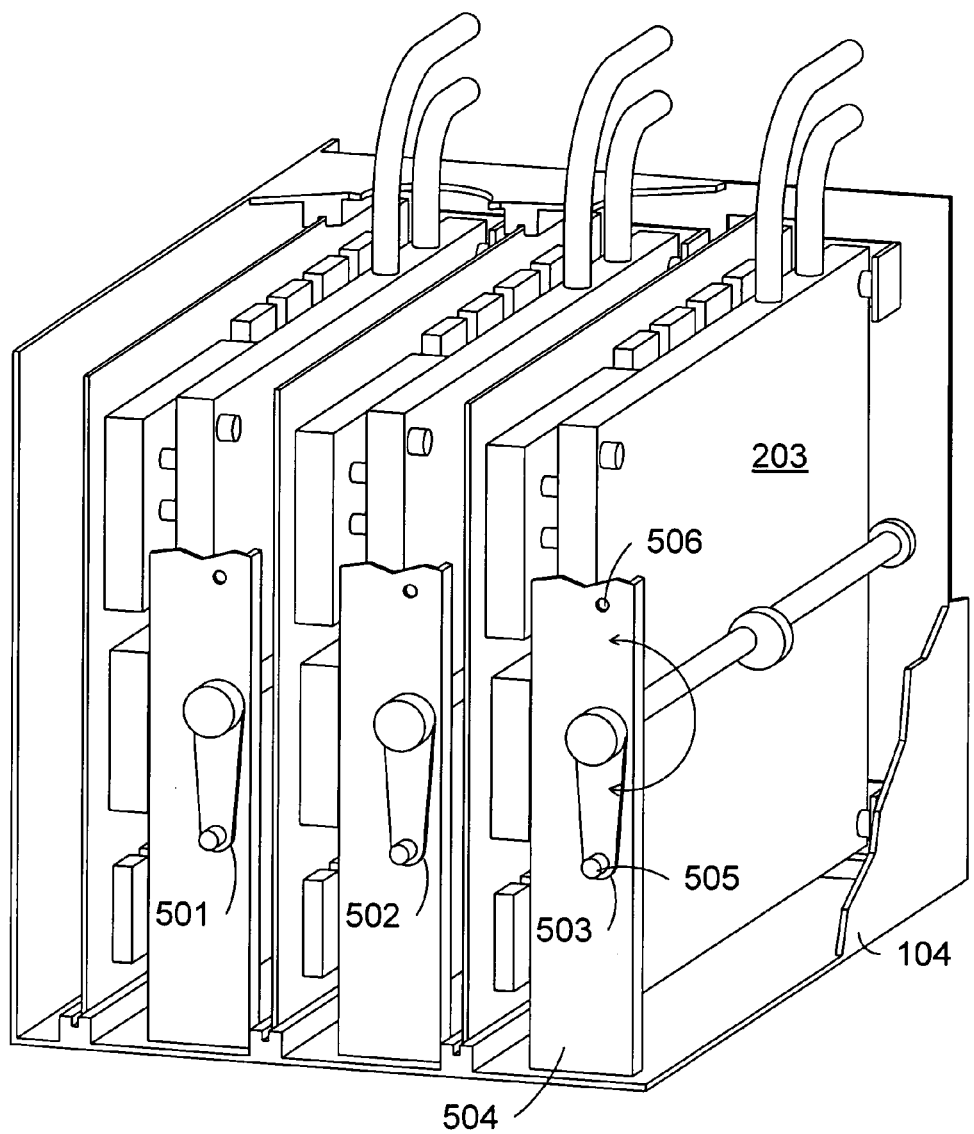
FIG. 5 shows actuating levers in accordance with an example embodiment of the invention.

Preferably, each cam shaft 206, 207, 208 is provided with an actuating and locking mechanism. A technician could simply turn the cam shafts using a wrench inserted in a fitting formed in the end of the cam shafts, but other actuating mechanisms are possible as well. FIG. 5 shows example actuating levers 501, 502, 503 provided for cam shafts 206, 207, 208. The example lever and locking mechanism associated with cold plate 203 is representative. An end of cam shaft 208 protrudes through front wall structure 504 of enclosure 104. Lever 503 is affixed to the end of cam shaft 208, and knob 505 allows actuation of cam shaft 208. Latching hole 506 provides a means for securing lever 503 when cold plate 203 is in its closed position. A spring-loaded pin (not shown) protruding from knob 505 may snap into latching hole 506, preventing the accidental movement of cold plate 203 from its closed position. A technician can easily move the mechanism to its open position by pulling on knob 505, withdrawing the pin from latching hole 506. Other apparatus and methods for providing such a locking mechanism are well known in the art.

Alternatively, or in addition, cam 209 may be an "over center" cam. That is cam 209 may be designed such that as cam shaft 208 turns toward its closed position, cold plate 203 moves toward blade 103 until the final portion of its travel, but during the last few degrees of rotation of cam shaft 208 before reaching the closed position, cold plate 203 moves slightly away from blade 103. The spring mounting of cold plate 203 thus provides a holding force on cam 209. In order to move cam 209 back to its open position, this initial holding force must be overcome.

One of skill in the art will readily envision other locking mechanisms for holding a cold plate in a closed position in accordance with other example embodiments of the invention.

Figure 6:
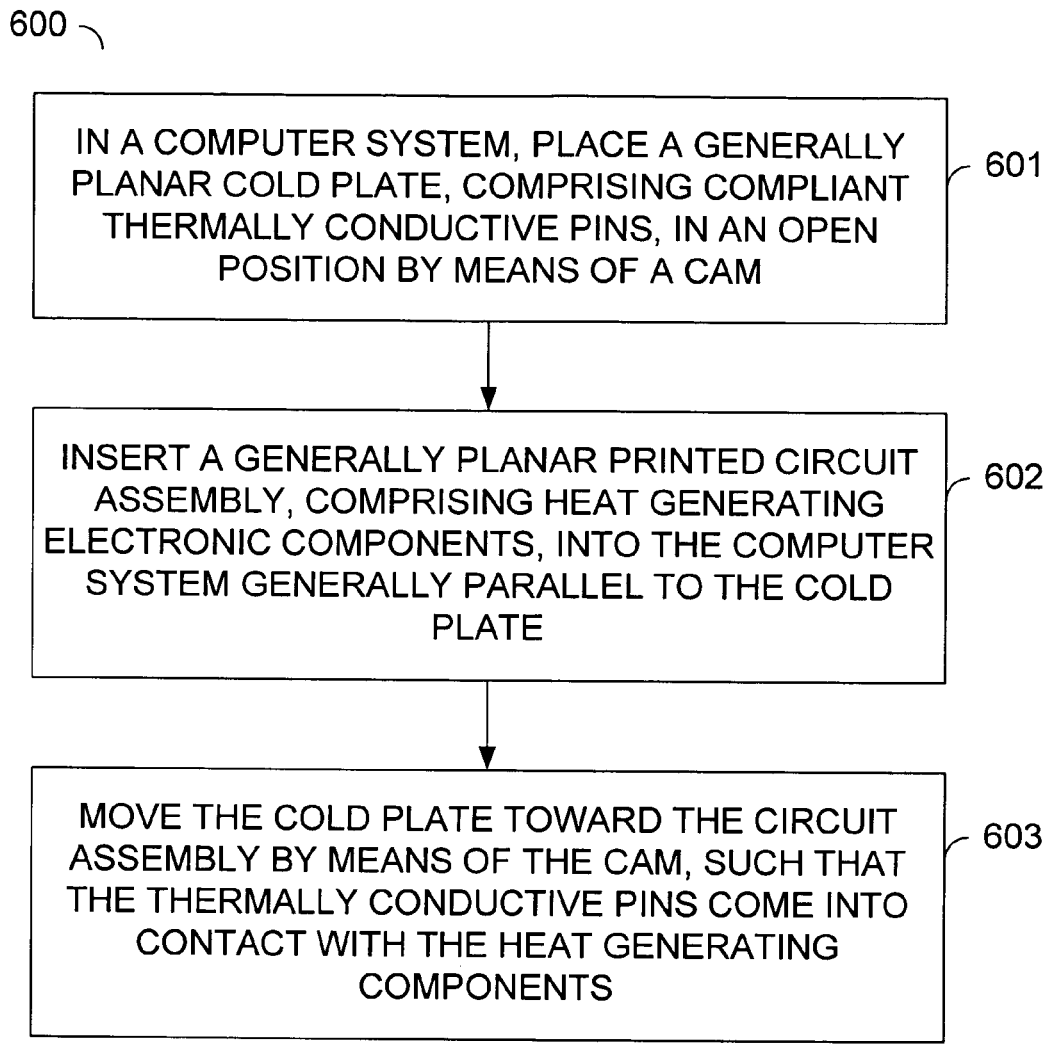
FIG. 6 shows a flowchart of a method of servicing a computer system, in accordance with an example embodiment of the invention.

FIG. 6 shows a flowchart of a method 600 of servicing a computer system, in accordance with an example embodiment of the invention. In step 601, a generally planar cold plate in a computer system, comprising compliant thermally conductive pins, is placed in an open position by means of a cam. In step 602, a generally planar printed circuit assembly, comprising heat generating electronic components, is inserted into the computer system, generally parallel to the cold plate. In step 603, the cold plate is moved toward the circuit assembly by means of the cam, such that the compliant thermally conductive pins come into contact with the heat generating electronic components.

Figure 7:
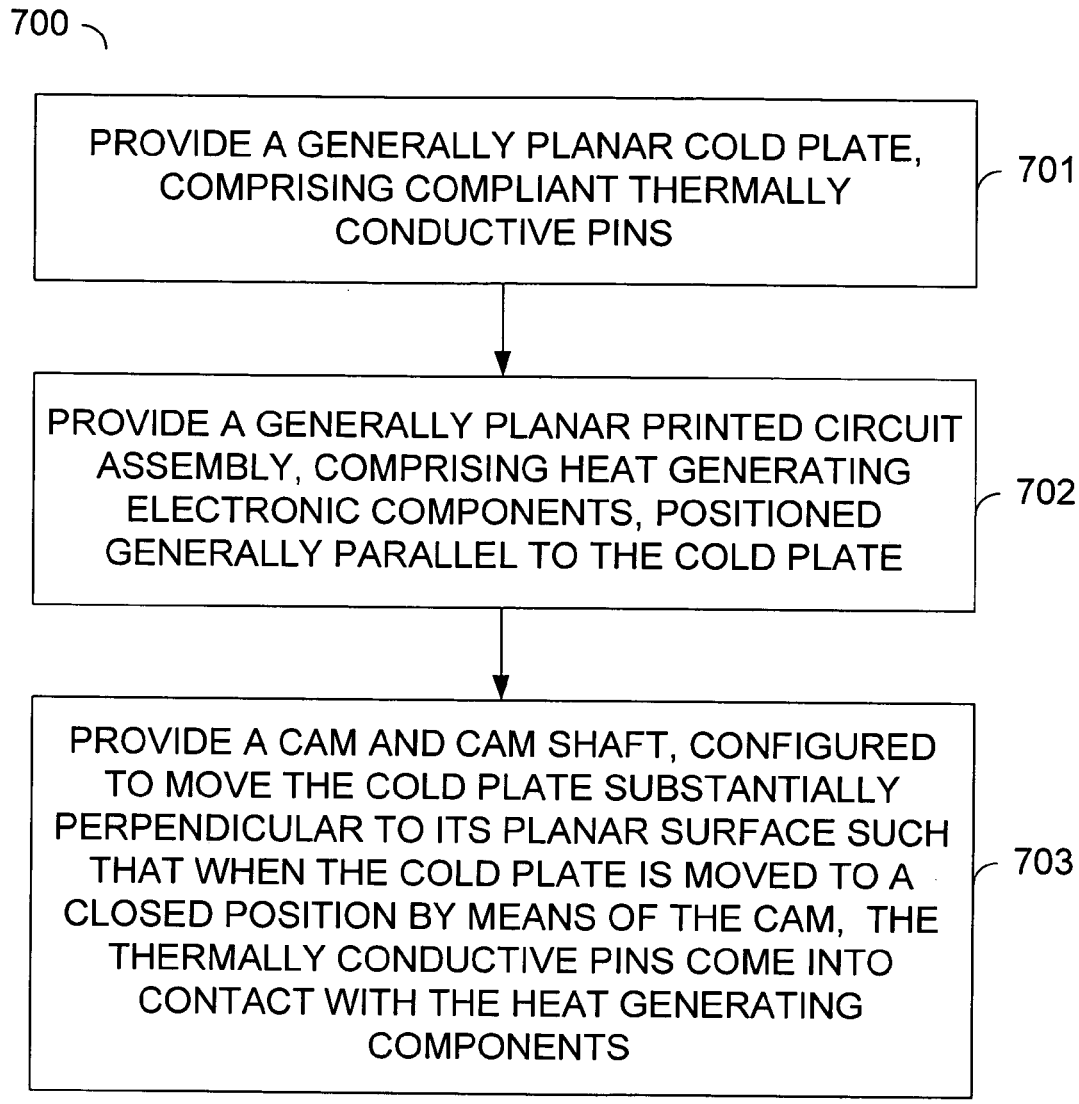
FIG. 7 shows a flowchart of a method of cooling a computer system component, in accordance with an example embodiment of the invention.

FIG. 7 shows a flowchart of a method 700 of cooling a computer system component, in accordance with an example embodiment of the invention. In step 701, a generally planar cold plate is provided, the cold plate comprising one or more compliant thermally conductive pins. In step 702, a generally planar printed circuit assembly is provided, the printed circuit assembly comprising one or more heat generating electronic components, and the printed circuit assembly positioned generally parallel to the cold plate. In step 703, a cam and cam shaft are provided, the cam and cam shaft configured to move the cold plate substantially perpendicular to its planar surface such that when the cold plate is moved to a closed position by means of the cam, the one or more compliant thermally conductive pins come into contact with the one or more heat generating electronic components.

Figure 8:
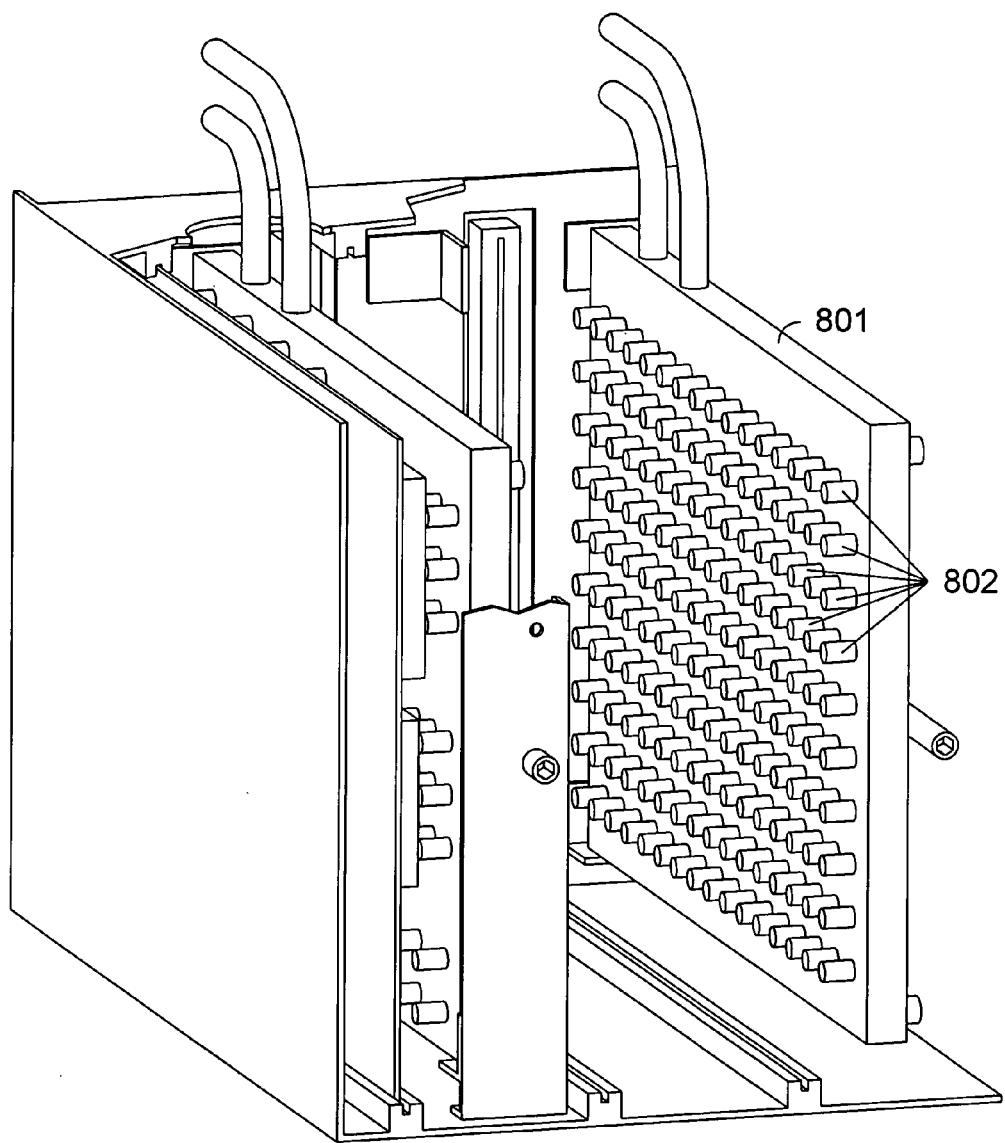
FIG. 8 shows a cold plate with pins spaced uniformly apart, in accordance with an example embodiment of the invention.
Figure 9:
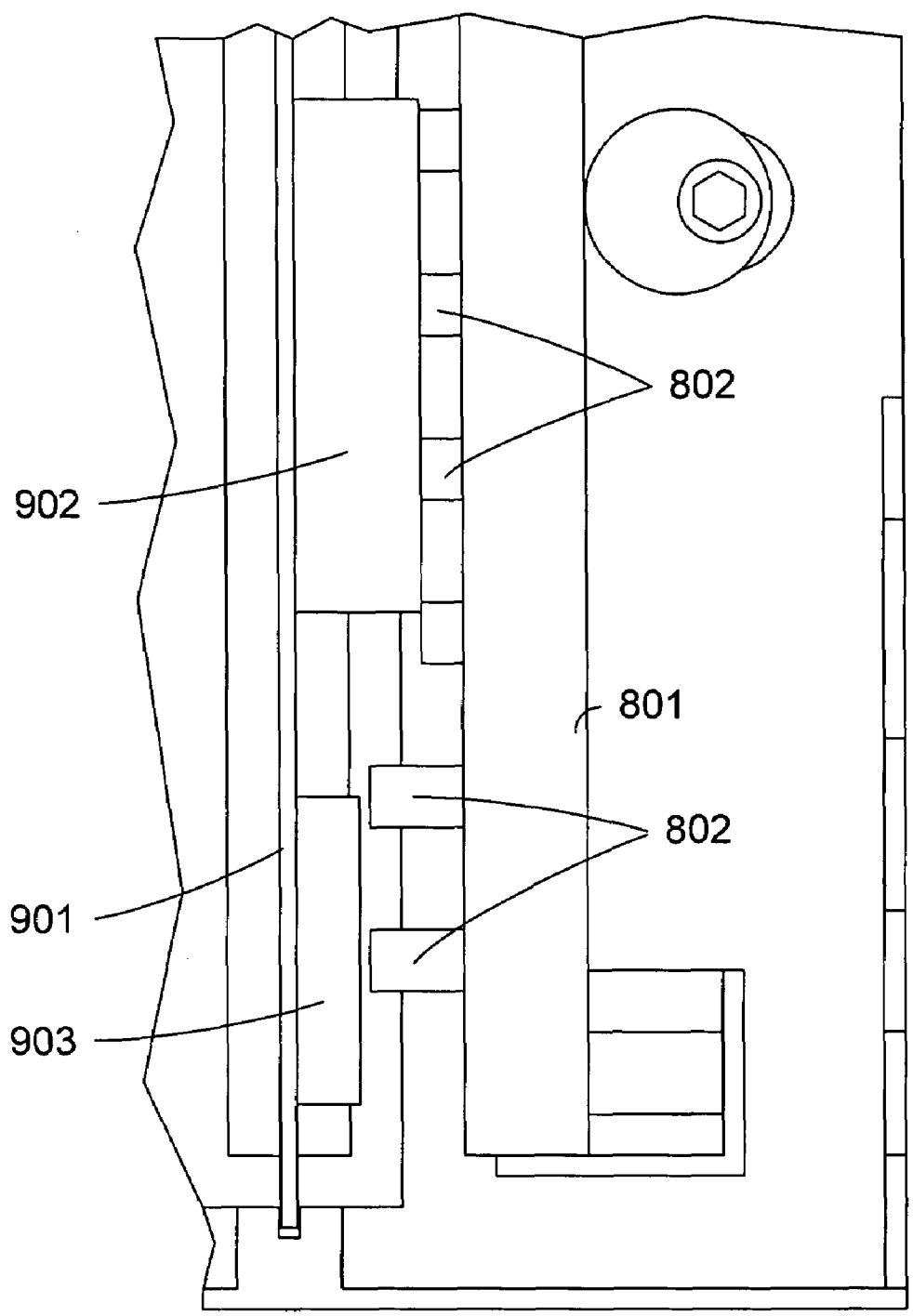
FIG. 9 shows the cold plate of FIG. 8 in its closed position, in accordance with an example embodiment of the invention.

In an alternative example embodiment of the invention, the pins populating at least one cold plate are positioned in a uniformly-spaced grid, rather than in an arrangement as shown in FIG. 3 where pin locations were selected based on the arrangement and kind of components on the corresponding circuit board. FIG. 8 shows a cold plate 801 with pins 802 spaced uniformly apart. Whether or not the pins are spaced uniformly, not all pins need contact heat generating components when the cold plate is in the closed position. FIG. 9 shows cold plate 801 in its closed position. Some of pins 802 contact relatively tall component 902 on circuit board 901. However, component 903 is short enough that even when cold plate 801 is in this closed position, none of pins 802 reach it. In some cases, this may be an advantage. For example, if pins are 802 are electrically conductive, it is preferable that they not touch small discrete components on circuit board 901, as such contact may cause short circuits or other electrical problems.

The invention claimed is:

1. A computer system, comprising:
   a generally planar printed circuit assembly comprising one or more heat generating electronic components;
   a generally planar cold plate comprising one or more compliant thermally conductive pins, the cold plate positioned generally parallel to the printed circuit assembly;
   a cam shaft; and
   a cam affixed to the cam shaft, configured to move the cold plate toward the printed circuit assembly during rotation of the cam shaft, bringing the one or more compliant thermally conductive pins into contact with the one or more heat generating electronic components.

2. The computer system of claim 1, further comprising coolant circulating through the cold plate.

3. The computer system of claim 2, wherein the coolant is a refrigerated fluid.

4. The computer system of claim 2, wherein the printed circuit assembly can be replaced in the computer system without disconnecting any pipe through which the coolant circulates.

5. The computer system of claim 1, wherein the cold plate moves toward the printed circuit assembly when the cam shaft is rotated in a first direction, and moves away from the printed circuit assembly when the cam shaft is rotated in a second direction, opposite the first.

6. The computer system of claim 1, wherein the cold plate is mounted such that it is biased away from the printed circuit assembly.

7. The computer system of claim 1, wherein the cold plate is mounted such that it is biased toward the printed circuit assembly.

8. The computer system of claim 1, wherein the computer system is a blade server and wherein the printed circuit assembly is a blade.

9. The computer system of claim 1, wherein the cam is an over center cam.

10. The computer system of claim 1, wherein the pins are uniformly spaced apart on the cold plate.

11. A method of cooling a computer system component, comprising:
    providing a generally planar cold plate, the cold plate comprising one or more compliant thermally conductive pins;
    providing a generally planar printed circuit assembly, the printed circuit assembly comprising one or more heat generating electronic components, and the printed circuit assembly positioned generally parallel to the cold plate; and
    providing a cam shaft and a cam affixed to the cam shaft, the cam and cam shaft configured to move the cold plate substantially perpendicular to its planar surface such that when the cold plate is moved to a closed position by means of the cam, the one or more compliant thermally conductive pins come into contact with the one or more heat generating electronic components.

12. The method of claim 11, further comprising cooling the cold plate.

13. The method of claim 12, wherein cooling the cold plate is accomplished by circulating coolant through the cold plate.

14. The method of claim 13, wherein the coolant is a refrigerated fluid.

15. The method of claim 11, further comprising choosing the number and arrangement of the compliant thermally conductive pins based on the arrangement and kind of components on the printed circuit assembly.

16. A method of servicing a computer system, comprising:
    placing a generally planar cold plate, comprising one or more compliant thermally conductive pins, in an open position by means of a cam;
    inserting a generally planar printed circuit assembly, comprising one or more heat generating electronic components, into the computer system, substantially parallel to the cold plate; and
    moving the cold plate toward the circuit assembly by means of the cam, such that the one or more compliant thermally conductive pins come into contact with the one or more heat generating electronic components.

17. The method of claim 16, further comprising:
    placing the generally planar cold plate in the open position by means of the cam; and
    removing the generally planar circuit assembly from the computer system.

* * * * *